(12) United States Patent
Klass et al.

(10) Patent No.: US 8,301,943 B2
(45) Date of Patent: Oct. 30, 2012

(54) PULSE FLOP WITH ENHANCED SCAN IMPLEMENTATION

(75) Inventors: Edgardo F. Klass, Palo Alto, CA (US); Ashish R. Jain, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 334 days.

(21) Appl. No.: 12/705,839

(22) Filed: Feb. 15, 2010

(65) Prior Publication Data

US 2011/0202809 A1    Aug. 18, 2011

(51) Int. Cl.
*G01R 31/28* (2006.01)
(52) U.S. Cl. ........................................................ 714/726
(58) Field of Classification Search .................. None
See application file for complete search history.

(56) References Cited

U.S. PATENT DOCUMENTS

| | | | | |
|---|---|---|---|---|
| 5,689,517 A | * | 11/1997 | Ruparel | 714/731 |
| 5,717,700 A | * | 2/1998 | Crouch et al. | 714/726 |
| 5,719,878 A | * | 2/1998 | Yu et al. | 714/726 |
| 5,898,330 A | | 4/1999 | Klass | |
| 6,023,179 A | | 2/2000 | Klass | |
| 6,348,825 B1 | | 2/2002 | Galbi et al. | |
| 6,911,845 B2 | | 6/2005 | Hossain et al. | |
| 7,000,164 B2 | * | 2/2006 | Siegel et al. | 714/731 |
| 7,157,930 B2 | | 1/2007 | Hirata | |
| 7,320,098 B2 | * | 1/2008 | Shin | 714/726 |
| 7,332,949 B2 | | 2/2008 | Kim | |
| 7,345,519 B2 | * | 3/2008 | Hirata | 327/208 |
| 7,373,569 B2 | | 5/2008 | Klass | |
| 7,543,205 B2 | * | 6/2009 | Abhishek | 714/726 |
| 7,590,900 B2 | | 9/2009 | Kim et al. | |
| 7,650,549 B2 | * | 1/2010 | Branch et al. | 714/731 |
| 2007/0022344 A1 | * | 1/2007 | Branch et al. | 714/731 |
| 2007/0260951 A1 | * | 11/2007 | Subramanian et al. | 714/726 |
| 2008/0016417 A1 | * | 1/2008 | Sinha et al. | 714/718 |

* cited by examiner

*Primary Examiner* — Guerrier Merant
(74) *Attorney, Agent, or Firm* — Lawrence J. Merkel; Meyertons, Hood, Kivlin, Kowert & Goetzel, P.C.

(57) ABSTRACT

In an embodiment, a clocked storage device such as a pulse flop is provided. The pulse flop includes a latch coupled to receive a scan data input to the pulse flop. The latch receives the scan data input during one of the phases of the clock, and retains the received input during the other phase. The other phase is the phase in which the pulse to the pulse flop occurs. Thus, when scan data is captured in the pulse flop, the latch at the next pulse flop in the chain may be closed and may prevent a race condition in propagating the scan data.

17 Claims, 3 Drawing Sheets

PULSE FLOP WITH ENHANCED SCAN IMPLEMENTATION

BACKGROUND

1. Field of the Invention

This invention is related to the field of integrated circuits and, more particularly, to clocked storage circuits in integrated circuits.

2. Description of the Related Art

Integrated circuits typically include digital circuitry. The digital circuitry performs logical operations on inputs to produce outputs, which may be input to other on-chip digital circuitry or may be outputs of the integrated circuit. In many cases, the digital circuitry is clocked by one or more clock signals. The clock signals force the digital circuitry to operate synchronously, which ensures predictable operation of the integrated circuit and can simplify timing analysis during the design of a complicate integrated circuit.

Clocked digital circuits include clocked storage devices to capture outputs from digital circuitry responsive to the clock signal that controls the clocked storage devices. The devices provide the captured outputs as inputs to other digital circuitry for processing during the following clock cycle of the clock signal. One popular type of clocked storage device is the pulse flop. A pulse flop generates a narrow pulse responsive to the clock signal. During the pulse, the input state is captured and propagated to the output of the flop. The pulse flop is generally fast, and also has short setup and hold time characteristics.

For testing purposes, the clocked storage devices of an integrated circuit are often linked into a scan chain. Data can be scanned into the clocked storage devices using the scan chain, one or more clock cycles may be performed, and the resulting captured data may be scanned out of the scan chain. The resulting data can be compared to expected data to detect defects in the integrated circuit. Additionally, data can be scanned out for debug purposes.

Scanning into and out of pulsed flops has created timing issues. The pulse flops rapidly propagate data from the input to the output (and scan data output), and thus the data may reach the scan data input of the next flop in the chain rapidly. A race condition thus exists, and may cause errant operation in the integrated circuit.

SUMMARY

In an embodiment, a clocked storage device such as a pulse flop is provided. The pulse flop includes a latch coupled to receive a scan data input to the pulse flop. The latch receives the scan data input during one of the phases of the clock, and retains the received input during the other phase. The other phase is the phase in which the pulse to the pulse flop occurs. Thus, when scan data is captured in the pulse flop, the latch at the next pulse flop in the chain may be closed and may prevent a race condition in propagating the scan data.

BRIEF DESCRIPTION OF THE DRAWINGS

The following detailed description makes reference to the accompanying drawings, which are now briefly described.

Figure 1:
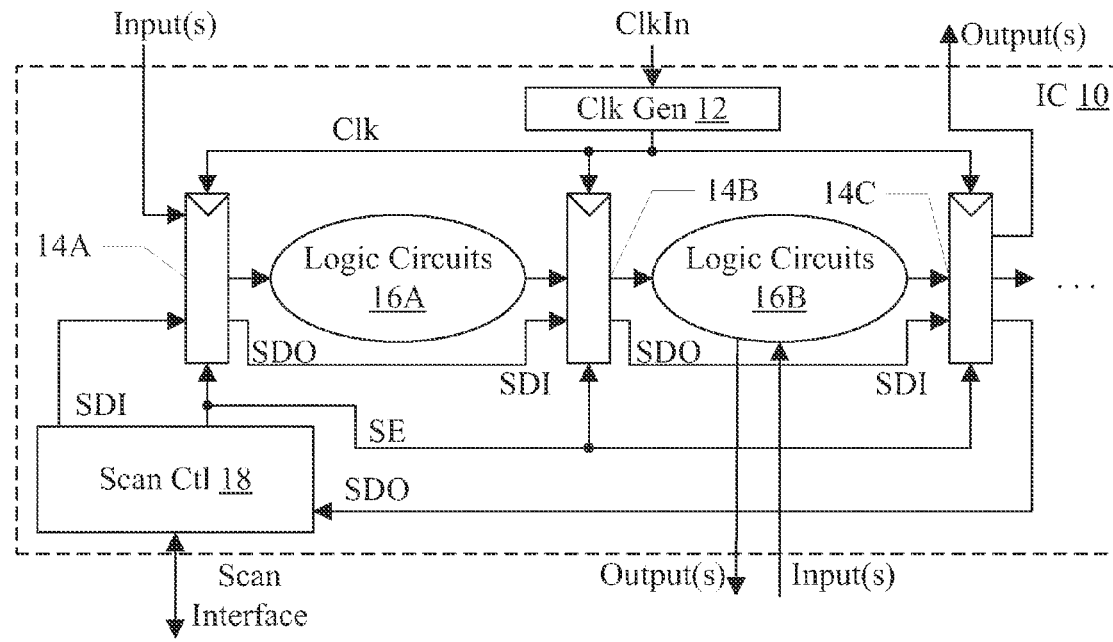
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) 10 is shown. In the illustrated embodiment, the integrated circuit 10 includes a clock generator circuit 12, flops such as 14A-14C, logic circuits such as logic circuits 16A-16B, and a scan control circuit 18. The clock generator circuit 12 is coupled to receive an input clock (ClkIn) to the IC 10 and is configured to generate one or more clocks for use in the IC 10. For example, the clock Clk may be generated by the clock generator circuit 12 and supplied to the flops 14A-14C in FIG. 1. That is, the clock Clk may be the clock signal that controls the flops 14A-14C. Each of the flops 14A-14C is coupled to receive the clock Clk on its clock input.

The flops 14A-14C are coupled into a scan chain in this embodiment via scan data inputs (SDIs) and scan data outputs (SDOs) of each flop. Specifically, a scan chain is formed by connecting each SDO of a flop to an SDI of another flop, although buffering may be included as desired. The SDO of the last flop in the chain may be provided to the scan control circuit 18 or may be output directly on a pin of the IC 10. The SDI of the first flop may be coupled to the scan control circuit 18 or may be input directly from a pin of the IC 10. There may be multiple scan chains in the IC 10. As illustrated in FIG. 1, the SDI of the flop 14A is coupled to the scan control circuit

18; the SDO of the flop 14A is coupled to the SDI of the flop 14B; and the SDO of the flop 14B is coupled to the SDI of the flop 14C.

Accordingly, the flops 14A-14C may be coupled in series in the scan chain. During scanning operations, (indicated via the assertion of a scan enable, or SE, signal to the flops 14A-14C), the flops 14A-14C may act as a shift register for data being scanned into the flops. That is, data for the flop 14C may flow over the SDI of the flop 14A, into storage in the flop 14A, then on the SDO of the flop 14A to the SDI of the flop 14B, into storage in the flop 14B, and then on the SDI of the flop 14C. That is, data may be serially shifted in through the scan chain. Once the data is in place, one or more clock cycles may elapse with the scan enable deasserted. During these clock cycles, the logic circuits 16A-16B may evaluate their inputs and generate outputs to be captured by the flops 14A-14C. Subsequently, the scan enable may be asserted again to shift out the captured data.

Accordingly, if there is a fault in the logic circuits and/or flops in the IC 10, one or more bits of the resulting data captured by the flops 14A-14C may not be accurate as compared to the expected values for normal operation. The scanned out data may be compared to the expected data to detect the fault. Furthermore, the scanned out data may be displayed for debugging purposes (e.g. a human user may interpret the data to attempt to locate incorrect operation).

The scan control circuit 18 may be configured to control the scan operation within the integrated circuit 10. The scan control circuit 18 may be configured to communicate with external circuitry (e.g. test/debug circuitry) via a scan interface on one or more pins of the IC 10. For example, a joint test access group (JTAG) interface may be used, or any other standard or proprietary interface may be used. In the illustrated embodiment, the scan control circuit 18 supplies the SDI to the first flop in the scan chain and receives the SDO of the last flop in the scan chain. Alternatively, the SDI and SDO may be coupled directly to pins of the IC 10, or may both be coupled to pins and to the scan control circuit 18. In response to commands on the scan interface to activate scan, the scan control circuit 18 may assert the scan enable to scan data into or out of the scan chain.

The flops 14A-14C are coupled to receive data inputs and provide data outputs. Each flop 14A-14C in FIG. 1 may represent multiple flops. Some flops are coupled to receive inputs to the IC 10, such as one or more inputs provided to the flop 14A in FIG. 1. Other flops may receive inputs from the logic circuits 16A-16B, such as flops 14B and 14C in FIG. 1. Flops may provide outputs of the IC 10, such as flops 14C. In some embodiments, some inputs and/or outputs may be received/generated by the logic circuits 16A-16B directly (e.g. as shown for the logic circuits 16B in FIG. 1). Flop outputs may also be inputs to the logic circuits 16A-16B (e.g. the logic circuits 16A receive outputs from the flops 14A and the logic circuits 16B receive outputs from the flops 14B).

The logic circuits 16A-16B are configured to operate on inputs to generate outputs. When taken as a whole across the IC 10, the logic circuits 16A-16B may implement the operation for which the IC 10 is designed. The logic circuits may include any type of logic circuitry, static and/or dynamic circuits, etc.

The clock Clk controls the flops 14A-14C, as mentioned above. In particular, the clock Clk may control the capture and/or propagation of data through the flops 14A-14C. The Clk signal may oscillate at a defined operating frequency for the IC 10 (although the frequency may vary during use in some embodiments, e.g. as part of a power management scheme implemented by the IC 10). Each period of the Clk signal may be referred to as a clock cycle. At a given point during each clock cycle, the flops 14A-14C may capture and/or propagate data. The clock cycle may have phases: a high phase and a low phase. The high phase may be the portion of the clock cycle when the clock signal is high, and the low phase may be the portion of the clock cycle when the clock signal is low. The clock signal may also be referred to as having edges. A rising edge may be the transition from the low phase to the high phase (beginning the high phase and ending the low phase). The falling edge may be the transition from the high phase to the low phase (beginning the low phase and ending the high phase).

The clock generator circuit 12 may include any clock generation circuitry. For example, the clock generator circuit 12 may include one or more phase lock loops (PLLs) that receive the ClkIn as a reference clock and lock the phase of the generated clocks such as Clk to the ClkIn The clock generator circuit 12 may include one or more clock divider and/or clock multiplier circuits.

Various signals, such as the scan enable signal, may be referred to as asserted or deasserted herein. Generally, a signal may be defined to be asserted at either a logic one (high) level or a logic zero (low) level. The signal is deasserted at the other level. Depending on the receiving circuitry, it may be desirable to assert a signal high, or assert a signal low. If needed for clarity, a signal may be referred to herein as asserted high, or asserted low.

Flops 14A-14C are used as an example herein. However, any clocked storage device may be used in other embodiments. A clocked storage device may be any device that is configured to capture and retain input data according to a clock signal, and provide the data on an output according to the clock signal. Clocked storage devices may include flops, latches, registers, etc. Each clocked storage device may include at least one storage circuit that is configured to retain the data stored into the device. The storage circuit may also be referred to as a storage cell.

Figure 2:
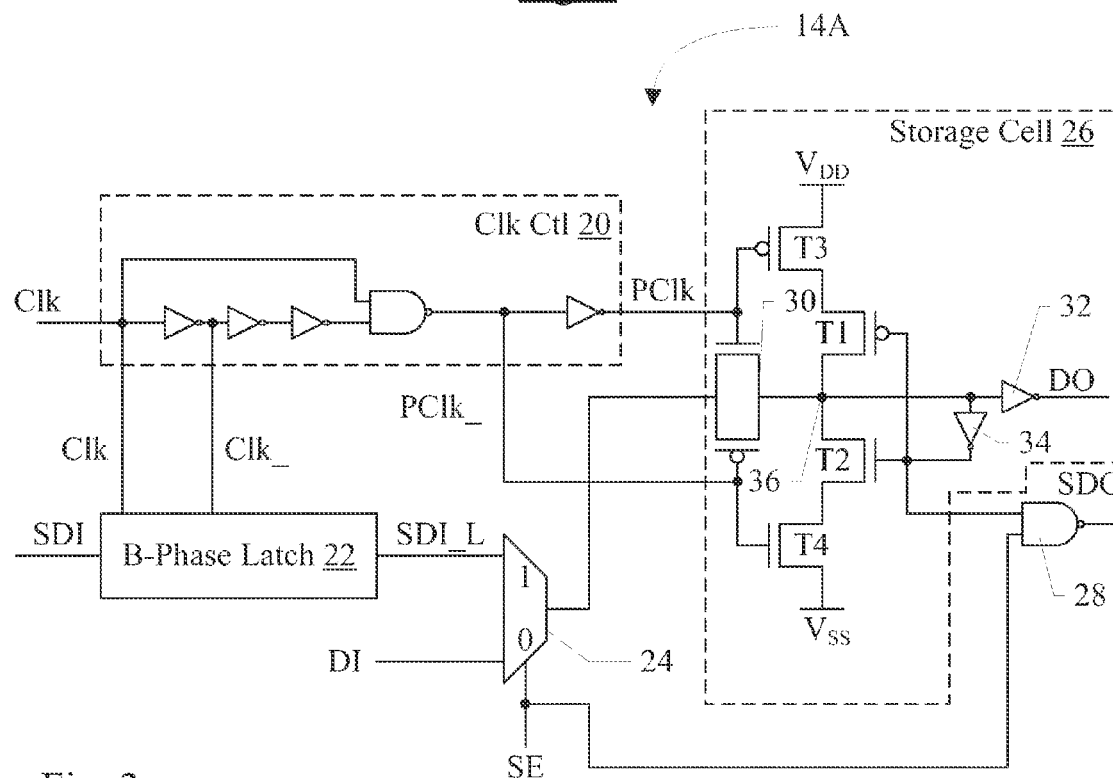
FIG. 2 is a circuit diagram of one embodiment of a clocked storage device.

Turning next to FIG. 2, a circuit diagram of one embodiment of one of the flops 14A is shown. In the embodiment of FIG. 2, the flop 14A includes a clock control circuit 20, a latch 22, a multiplexor (mux) 24, and a storage cell 26. The storage cell 26 is coupled to the clock control circuit 20 and the mux 24. More particularly, the storage cell 26 is coupled to receive a pulse clock (PClk) and pulse clock bar (PClk) from the clock control circuit 20, and is coupled to receive the output of the mux 24 as an input to be captured by the storage cell 26 responsive to the PClk. The latch 22 is coupled to receive the SDI for the flop 14A, and is coupled to receive clock (Clk) and clock bar (Clk_) signals from the clock control circuit 20. The output of the latch 22 is a latched SDI (SDI_L) signal, which is input to the mux 24. The other input of the mux 24 is the data input to the flop 14A (DI). For example, the DI may be one of the inputs to the IC 10 or an output from one of the logic circuits 16A-16B (e.g. see FIG. 1). The selection control on the mux 24 is the SE signal to the flop 14A, which is also an input to a NAND gate 28 which generates the SDO of the flop 14A.

The latch 22 may capture the SDI, and may provide the latched output SDI_L to the mux 24. In an embodiment, the latch 22 may be open during the opposite phase of the clock to the phase in which the pulse to the storage cell 26 is generated by the clock control circuit 20. The latch 22 may be closed during the phase in which the pulse occurs. Accordingly, the SDI_L may be stable during the phase in which the pulse occurs. When scan is enabled (SE asserted), the output of the mux 24 is stable during the phase that the pulse occurs, and thus the input to the storage cell 26 is stable. A potential race condition between the SDI and the clock pulse to the storage cell 26 may thus be avoided, in an embodiment. When scan is not enabled (SE deasserted), the mux 24 may select the DI input and the timing of the output of the mux 24/input of the storage cell 26 may be controlled by the timing of the DI input.

In the illustrated embodiment, the pulse occurs in the high phase of the clock. Accordingly, the latch 22 may be open in the low phase of the clock. The low phase may also be referred to as the B-phase (and the high phase may be referred to as the A-phase). Accordingly, the latch is labeled a B-phase latch since it captures its value in the B-phase. In other embodiments, the pulse may occur in the B-phase and the latch 22 may be an A-phase latch. A latch may be referred to as open if the input of the latch is being passed to the output. The latch may capture a value while open. The latch may be referred to as closed if the output is isolated from the input and the latch is retaining the captured value. The captured value may be the state of the input at approximately the time the latch closed (e.g. at the end of the B-phase in this embodiment). To reliably capture the value, the value may need to be stable for a period of time prior to the closing of the latch (referred to as the setup time) and for a period of time after the closing (referred to as the hold time).

The storage cell 26 is configured to capture the state on the output of the mux 24 responsive to the PClk/PClk_ from the clock control circuit 20. As mentioned above, the PClk may be a pulse. A pulse may be a narrow assertion of the signal (e.g. as compared to Clk, which asserts for a full phase of the clock signal). For example, in FIG. 2, the clock control circuit 20 may generate a pulse with a width of approximately 3 inverter delays. Viewed in another way, the pulse may be asserted for significantly less time than the phase of the Clk clock. For example, the pulse width may be less than 10% of the width of a phase. The pulse width may be sufficiently wide to change the state of the storage cell 26, if the input of the storage cell 26 is the opposite of the retained value in the cell. The pulse width may be somewhat wider than the minimum width to change the state, to ensure change of state in the cell so as to permit guard banding of the operation, for example. In the illustrated embodiment, the pulse on the PClk is asserted high (and PClk_ is asserted low). Other embodiments may use an asserted-low pulse if desired.

In the illustrated embodiment, as mentioned above, the clock control circuit 20 may generate the PClk and PClk_. The clock control circuit 20 includes a NAND gate that has one input coupled to receive the Clk signal and the other input coupled to the output of a series of three inverters. The series of three inverters are also coupled to receive the Clk signal. Accordingly, on the rising edge of the Clk signal, both inputs to the NAND gate will be a logic one for the delay time of the series inverters, and the output of the NAND gate is a logic zero. After the series inverter delay, the output of the inverters switches low, and the output of the NAND gate switches high and remains high until the next rising edge of the Clk input. The output of the NAND gate is thus an asserted-low pulse (PClk_ in this embodiment). An inverter on the output of the NAND gate generates the PClk signal. Other embodiments may use any pulse generation circuitry, including any Boolean equivalents of the circuitry shown in FIG. 2. Additionally, different pulse widths may be generated (e.g. by varying the number of inverters in the series chain of inverters, for example).

The storage cell 26 may include any circuitry that may capture an input value responsive to an input pulse clock and that may retain the value when the pulse is not asserted. The storage cell 26 may thus be referred to as a pulse-triggered storage cell or storage device. In the illustrated embodiment, the storage cell 26 includes a passgate 30 coupled to receive the output of the mux 24 and coupled to a storage node 36 within the storage cell 26. The passgate 30 opens in response to the pulse assertion and is closed when the pulse is deasserted. Accordingly, the input to the storage cell 26 may drive the storage node 36 during pulse assertion.

The storage node 36 is an input to an output inverter 32 of the storage cell 26 and to an inverter 34 that is part of the retention circuitry along with the transistors T1 and T2. That is, the inverter 34 and the T1/T2 inverter may form cross-coupled inverters that may be used to retain a value driven onto the storage node 36 when the pulse clock is asserted. The output of the inverter 34 is the input to the T1/T2 inverter, and the output of the T1/T2 inverter drives the storage node 36. The output inverter 32 may provide drive capability for the output of the flop 14A (DO), and thus may be larger than the retention inverters in the storage cell 26 (e.g. the inverter 34 and the T1/T2 inverter). Other embodiments may combine the output inverter 32 and the inverter 34, if desired.

In the illustrated embodiment, the T1/T2 inverter is tristated during the pulse assertion using the transistors T3 and T4. That is, when the pulse clock is asserted, the transistors T3 and T4 are turned off (deactivated), which prevents the inverter T1/T2 from driving the node 36. Thus, the inverter T1/T2 may not resist the change in state of the storage cell 26 during pulse assertion, which may speed transition times in the storage cell 26. Other embodiments may not include the transistors T3 and T4, if desired.

In the illustrated embodiment, the transistors T2 and T4 are N-type metal-oxide-semiconductor (NMOS) transistors and the transistors T1 and T3 are P-type MOS (PMOS) transistors. Generally, a transistor having the circle on its gate terminal is a PMOS and a transistor without the circuit on its gate terminal may be an NMOS transistor. Accordingly, other transistors described herein may be either NMOS or PMOS based on the transistor symbol shown for that transistor in the drawings. In many cases, complementary circuits using the opposite configuration of NMOS and PMOS transistors may be used in other embodiments.

The storage node 36 is also an input to the NAND gate 28 in this embodiment. The other input to the NAND gate 28 is the scan enable signal. Thus, if the scan enable signal is deasserted, the output of the NAND gate 28 is constant, independent of the value on the storage node 36. Accordingly, the SDO may be prevented from toggling when the scan enable signal is deasserted. Since the SDO is coupled to an SDI that is also not being used when scan is disabled, the SDO need not toggle with the value in the storage node 36. Power may be conserved by not toggling SDO when scan is disabled, in some embodiments.

Figure 3:
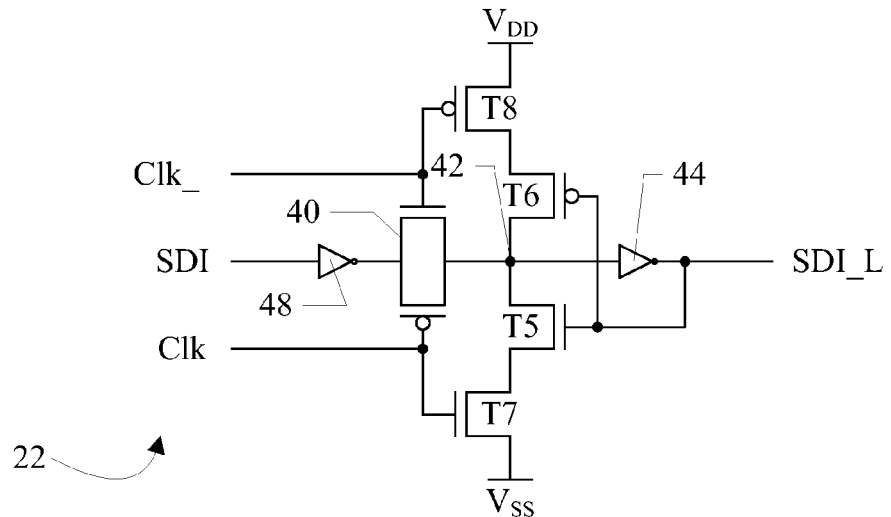
FIG. 3 is a circuit diagram of one embodiment of a latch shown in FIG. 2.

Turning next to FIG. 3, a circuit diagram illustrating one embodiment of the B-phase latch 22 is shown. In the illustrated embodiment, the latch 22 includes a pass-gate 40 controlled by the Clk and Clk_signals as shown in FIG. 3. The SDI input is provided to an inverter 48, the output of which is the input to the pass gate 40. The output of the passgate 40 is a storage node 42 of the latch 22. The storage node 42 is retained via cross-coupled inverters, including the inverter 44 and the inverter formed from the transistors T5 and T6. The T5/T6 inverter is also tristatable in this embodiment, similar to the T1/T2 inverter in FIG. 2, via the transistors T7 and T8 controlled by the Clk and Clk_signals. Accordingly, the T5/T6 inverter may be tristated when the latch 22 is open, and may not resist the output of the pass gate 40 changing the state of the storage node 42.

The inverter 44 may also serve as the output inverter for the latch 22 in this embodiment. Other embodiments may have a separate retention inverter and output inverter, similar to the storage cell 26 in FIG. 2. Accordingly, the SDI input passes through two inverters 44 and 48 in this embodiment. The SDI_L output is thus the same logical sense as the input SDI (i.e. a logic one on the SDI corresponds to a logic one on the SDI_L, and a logic zero on the SDI corresponds to a logic zero on the SDI_L). Other embodiments may use an odd number of inverters and the logic sense of the SDI_L signal may be the opposite of the SDI signal.

As mentioned above, other embodiments of the latch 22 may be used. For example, in an embodiment, the inverter 48 may be implemented as a tristate inverter control by the Clk signal. That is, the inverter 48 may be constructed similar to the T5/T6/T7/T8, except that the transistors T7 and T8 may be coupled to the opposite Clk/Clk_signals to tristate the inverter 48 during the A phase of the Clk. In such an embodiment, the passgate 40 may be eliminated.

Figure 4:
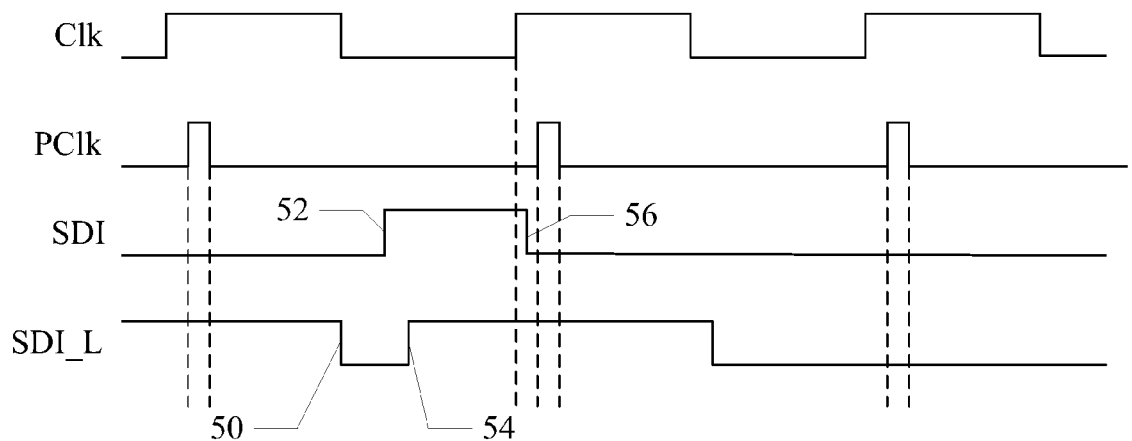
FIG. 4 is timing diagram illustrating various signals shown in FIGS. 2 and 3.

FIG. 4 is a timing diagram illustrating various signals of the latch 22 shown in FIG. 3. The timings of the signals in FIG. 4 have been shown changing at times that may differ from that in normal scan operation, to illustrate certain aspects of the operation of the latch 22. For example, the SDI inputs may change state at different times for the flops within the scan chain (i.e. flops that have their SDI inputs coupled to the SDO outputs of other flops, rather than the input to the scan chain). The Clk is shown, along with the PClk. The SDI and SDI_L signals are also shown. The SE signal is not shown, but is asserted throughout the time illustrated in FIG. 4.

In FIG. 4, the SDI is low and the SDI_L is high during the A phase of the Clk signal. Even though the SDI is low, the SDI_L signal does not change state because the latch 22 is closed. At the falling edge of the Clk clock, the SDI input passes through the latch 22 and the SDI_L signal transitions low (reference numeral 50). Subsequently, during the B-phase, the SDI_L signal transitions high (reference numeral 52) and the SDI_L signal follows after the inverter delays of the inverters 44 and 48 (reference numeral 54) since the latch 22 is open.

The SDI input signal is shown changing state immediately following the second rising edge of the Clk clock in FIG. 4 (reference numeral 56). However, since the latch 22 is closed, the SDI_L signal remains stable. Generally, the SDI signal may change state at any point that meets the hold time requirements of the latch 22, and the SDI_L may remain stable. Accordingly, a potential race condition between the SDI input and the pulse of the PClk may be alleviated by the latch 22.

Figure 5:
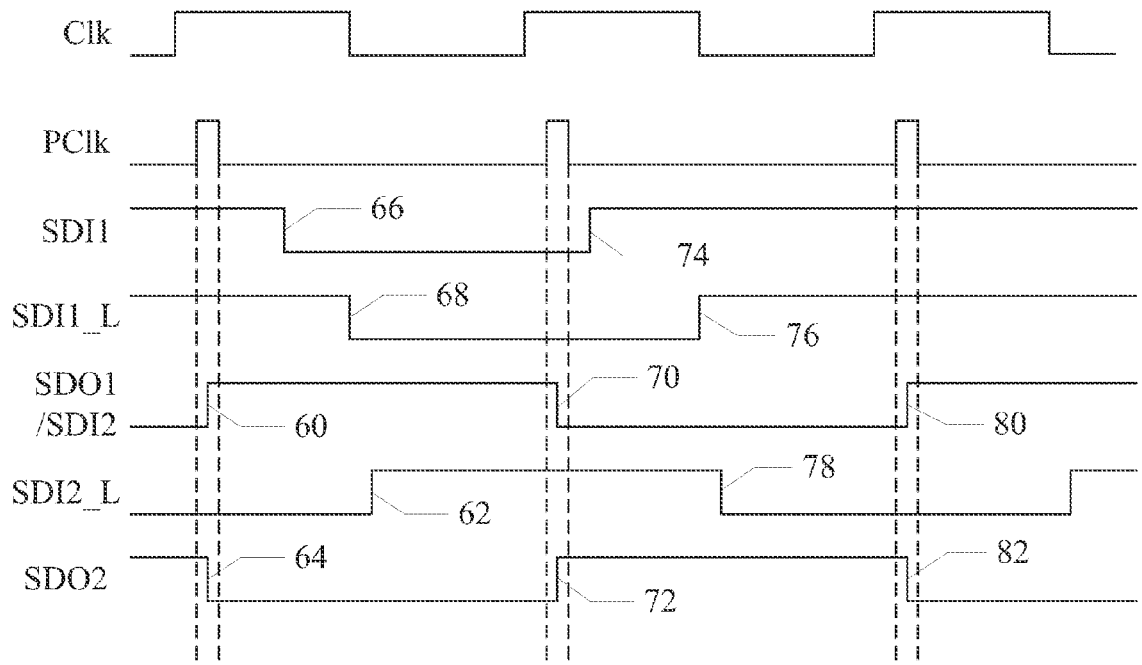
FIG. 5 is a timing diagram illustrating various signals in a scan chain shown in FIG. 1.

FIG. 5 is a timing diagram illustrating the propagation of SDO outputs to SDI inputs of the next flops in the scan chain, for one embodiment. Specifically, an SDI1 input may be the input to a first flop in the scan chain. The SDO1 output may be the SDO of the first flop, and may also be the SDI2 input to a second flop in the scan chain. Accordingly, SDO1 and SDI2 are shown as the same signal in FIG. 5. There may be delay in propagating the SDO1 to the SDI2 (e.g. wire delay and/or buffer delay) not illustrated in FIG. 5 for simplicity in the drawing. The SDO2 output of the second flop is also illustrated in FIG. 5. Latched SDI signals corresponding to each of SDI1 and SDI2 are illustrated (SDI1_L and SDI2_L in FIG. 5). Like FIG. 4, the SE input is not illustrated but is asserted throughout the time shown in FIG. 5.

Prior to the first A-phase of the clock Clk shown in FIG. 5, the SDI1 input is a logical one and the SDI1_L is also a logical one. The SDO1/SDI2 is a logical zero and the SDI2_L is also a logical zero. The SDO2 is a logical one. During the first A-phase of the Clk shown in FIG. 5, the PClk pulses. The storage cell 26 in the first flop captures the SDI1_L value and transmits it as the SDO1 value, transitioning to a logic 1 during the pulse (reference numeral 60). However, because the B-phase latch in the second flop is now closed, the SDI2_L does not change state in response to the SDI2 input changing to a logical one. Instead, the state changes in the B-phase of the clock (reference numeral 62). The SDO2 output changes to a logical zero based on the SDI2_L signal during the pulse (reference numeral 64). Accordingly, a potential race from SDO1 to SDI2 to SDO2 may be avoided via the latch 22 in the flops.

The SDI1 input is shown transitioning to a logical 0 in the A-phase of the Clk clock (reference numeral 66). The SDI1_L signal changes state during the B-phase (reference numeral 68). At the second pulse of the PClk shown in FIG. 5, the SDO1 transitions to a logical zero and the SDO2 transitions to a logical one (reference numerals 70 and 72, respectively), responsive to the SDI1_L and SDI2_L signals, respectively.

The SDI1 input changes state to a logical one during the second A-phase shown in FIG. 5 (reference numeral 74). The SD1_L signal changes state during the B-phase (reference numeral 76), and the SDI2_L signal changes state during the B-phase in response to the SDI2 input (reference numeral 78). At the next pulse of the PClk signal, the SDO1 and SDO2 outputs change state in response to the SDI1_L and SDI2_L signals, respectively (reference numerals 80 and 82, respectively).

As can be seen in FIG. 5, the SDI1_L and SDI2_L signals may provide stability for a wide period of time around the PClk pulses. Accordingly, the timing during scan of the scan chain may be robust and may permit proper scanning of the scan chain without race condition issues in the illustrated embodiment.

Figure 6:
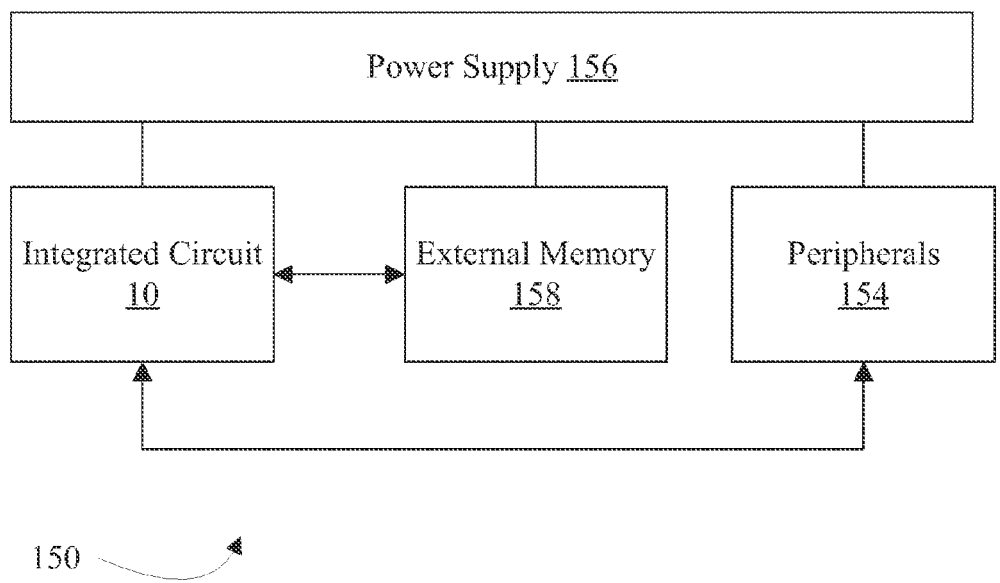
FIG. 6 is a block diagram of one embodiment of a system including the integrated circuit shown in FIG. 1.

Turning next to FIG. 6, a block diagram of one embodiment of a system 150 is shown. In the illustrated embodiment, the system 150 includes at least one instance of an integrated circuit 10 (from FIG. 1) coupled to one or more peripherals 154 and an external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A clocked storage device comprising:
a storage cell coupled to receive an input, wherein the storage cell is configured to capture a state of the input responsive to a pulse clock generated from a clock signal received by the clocked storage device, and wherein the pulse clock is generated responsive to a first edge of the clock signal that begins a first phase of a clock cycle of the clock signal during use, and wherein a width of the pulse is less than 10% of a width of the first phase of the first clock during use;
a latch coupled to receive a scan data input, wherein the latch is configured to be open during a second phase of the clock cycle, and wherein a latched scan data input signal from the latch is provided as the input to the storage cell responsive to scan being enabled; and
a multiplexor coupled to receive the latched scan data input signal and to receive a data input to the clocked storage device, and wherein the multiplexor is configured to select between the latched scan data input and the data input to the clocked storage device responsive to a scan enable signal, wherein the multiplexor is configured to select the latched scan data input responsive to an assertion of the scan enable signal indicating that scan is enabled, and wherein an output of the multiplexor is the input to the storage cell.

2. The clocked storage device as recited in claim 1 wherein the multiplexor is configured to select the data input to the clocked storage device responsive to a deassertion of the scan enable signal indicating that scan is not enabled.

3. The clocked storage device as recited in claim 1 wherein the latch is configured to ensure that the latched scan data input signal is stable during the pulse.

4. The clocked storage device as recited in claim 1 wherein the first edge is the rising edge of the clock signal, the first phase is the high phase, and the second phase is the low phase.

5. The clocked storage device as recited in claim 1 wherein the latch is configured to close responsive to the first edge.

6. A flop comprising:
a pulse-triggered storage device coupled to receive a pulse clock and configured to capture a value on an input to the pulse-triggered storage device responsive to a pulse on the pulse clock, wherein the pulse clock is derived from a first clock, and wherein a width of the pulse is less than 10% of a width of a phase of the first clock during use;
a latch coupled to receive a scan data input, wherein the latch is configured to be open in a first phase of a clock cycle of a clock that controls the flop and to be closed in a second phase of the clock cycle, wherein a pulse supplied to the pulse-triggered storage device occurs in the second phase; and
a circuit configured to supply a latched scan data input signal from the latch to the input of the pulse-triggered storage device.

7. The flop as recited in claim 6 wherein the circuit is configured to supply the latched scan data input signal responsive to an assertion of a scan enable signal to the flop.

8. The flop as recited in claim 7 wherein the circuit is configured to supply a data input signal to the flop as the input of the pulse-triggered storage device responsive to a deassertion of the scan enable signal.

9. The flop as recited in claim 6 wherein an output of the pulse-triggered storage device is a state stored in the pulse-triggered storage device, and wherein a scan data output of the flop is also the state stored in the pulse-triggered storage device only if the scan enable signal is asserted.

10. An integrated circuit comprising:
a plurality of pulse flops, each having a scan data input and a scan data output, wherein the scan data inputs are coupled to the scan data outputs in a serial fashion to form a scan chain;
a clock generator circuit configured to generate a clock input to the plurality of pulse flops;
wherein each of the plurality of pulse flops comprises a clock control circuit configured to generate a pulse responsive to the clock input, wherein the storage circuit is configured to capture state responsive to the pulse, and wherein the clock control circuit comprises an odd number of inverter circuits coupled in series and coupled to receive the clock input, and wherein the clock control circuit further comprises a logic circuit coupled to receive the clock input and an output of the series-coupled inverters, and wherein the logic circuit is configured to generate the pulse between a first edge of the clock input and a corresponding edge output from the series-coupled inverters; and
a scan control circuit coupled to provide a scan enable signal to the plurality of pulse flops;
wherein each of the plurality of pulse flops comprises a latch coupled to receive the scan data input and coupled to provide a latched scan data input to a storage circuit of the flop, wherein the storage circuit is configured to capture a state of the latched scan data input responsive to assertion of the scan enable from the scan control circuit.

11. The integrated circuit as recited in claim 10 wherein the latch is configured to ensure stability of the latched scan data input during a time that the storage circuit is to capture the state.

12. The integrated circuit as recited in claim 10 wherein the latch is configured to be open during an opposite phase of a clock input to the plurality of pulse flops to a phase in which the plurality of pulse flops capture state in their respective storage circuits.

13. The integrated circuit is recited in claim 12 wherein the opposite phase is the low phase.

14. A method comprising:
latching a scan data input to a clocked storage device in a latch within the clocked storage device during a first phase of a clock cycle;
pulsing a storage circuit within the clocked storage device during a second phase of the clock cycle different from the first phase, wherein the storage circuit is configured to capture a value on an input to the storage circuit responsive to a pulse on a pulse clock input of the storage circuit, wherein the pulse clock is derived from a first clock that defines the clock cycle, and wherein a width of the pulse is less than 10% of a width of the second phase; and
capturing the latched scan data input in the storage circuit responsive to the pulsing and further responsive to a scan enable input to the clocked storage device.

15. The method as recited in claim 14 further comprising:
pulsing the storage circuit a second time during a second clock cycle; and
capturing a data input to the clocked storage device responsive to the pulsing a second time.

16. The method as recited in claim 14 further comprising propagating captured scan data input from the storage circuit on a scan data output of the clocked storage device responsive to the scan enable being asserted, wherein a content of the storage circuit is not propagated on the scan data output responsive to the scan enable being deasserted.

17. The method as recited in claim 14 wherein the first phase is the low phase, and wherein the pulsing is responsive to a rising edge of a clock signal defining the clock cycle.

* * * * *